United States Patent [19]

Gordon et al.

[11] Patent Number: 4,997,279

[45] Date of Patent: Mar. 5, 1991

[54] OPTICAL BENCH FOR A SEMICONDUCTOR LASER AND METHOD

[75] Inventors: Eugene I. Gordon, Convent Station, N.J.; Robert J. Nielsen, Upper black Eddy, Pa.; John W. Stafford, Summit, N.J.

[73] Assignee: AMP Incorporated, Harrisburg, Pa.

[21] Appl. No.: 263,106

[22] Filed: Oct. 25, 1988

Related U.S. Application Data

[62] Division of Ser. No. 902,998, Sep. 2, 1986, Pat. No. 4,818,053.

[51] Int. Cl.$^5$ ............................................. G01B 11/25
[52] U.S. Cl. ..................................... 356/153; 356/400
[58] Field of Search ................. 356/153, 96.18, 96.20, 356/400, 138

[56] References Cited

U.S. PATENT DOCUMENTS

| | | | |
|---|---|---|---|
| 4,003,075 | 1/1977 | Yonezu et al. | 356/74 |
| 4,650,276 | 3/1987 | Lanzisera et al. | 350/96.20 |
| 4,722,587 | 2/1988 | Thorsten | 356/153 X |
| 4,772,123 | 9/1988 | Radner | 356/153 |

*Primary Examiner*—Mark Hellner
*Attorney, Agent, or Firm*—Gerald K. Kita

[57] ABSTRACT

An alignment fixture includes an optical bench 12 mounting a semiconductor laser 21, a monitor 23 of optical emission, a lens 27 focused for transmitting optical emission along an optical axis 43, a holder 26 mounting the lens 27, a pedestal 36 positioning a diaphragm 29 spaced for the lens 27, an optical fiber 45, a tube 49 surrounding the fiber 45 and joined to the fiber 45, a bushing 55 surrounding the tube 49 and joined to the optical bench 12, and a datum surface 16' on the bench 12 for aligning the lens 27 and the fiber 45 with the optical axis 43.

4 Claims, 3 Drawing Sheets

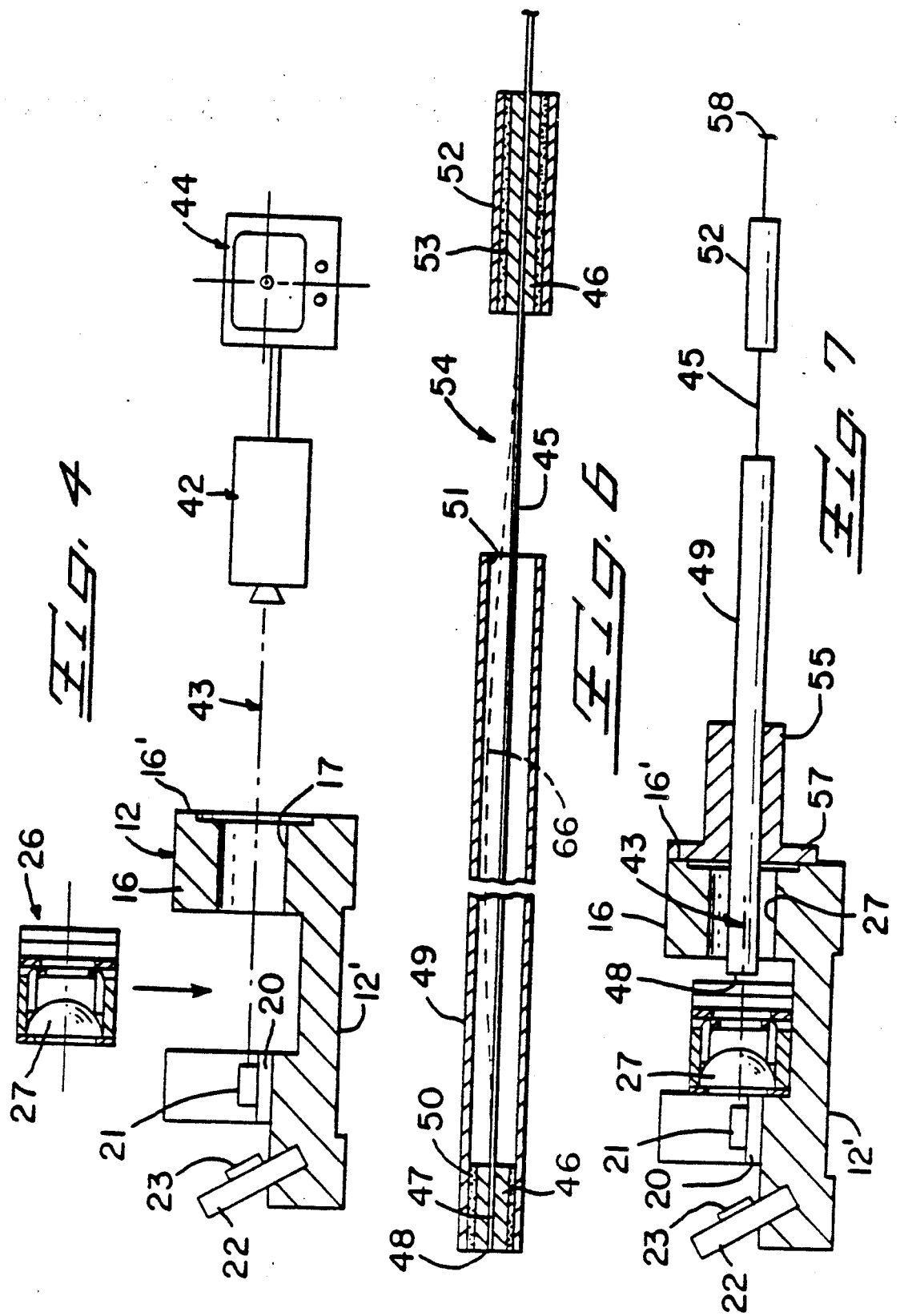

OPTICAL BENCH FOR A SEMICONDUCTOR LASER AND METHOD

This application is a divisional of application Ser. No. 06/902,998, filed Sept. 2, 1986 now U.S. Pat. No. 4,818,053.

FIELD OF THE INVENTION

This invention relates to an alignment fixture in the form of an optical bench for optically coupling a semiconductor laser, lens and optical fiber prior to installation in an hermetically sealed package.

BACKGROUND OF THE INVENTION

U.S. Pat. No. 4,003,074 discloses an optoelectronics package with an hermetically sealed enclosure containing a semiconductor laser and a monitor of optical emission from a rear facet of the semiconductor laser. A monitor, for example, a PIN diode, in response to the optical emission produces an output voltage for supply to an electrical circuit that controls the current applied to the semiconductor laser. The enclosure incorporates an optical lens for directing rays of optical emission in a narrow course externally of the enclosure. The enclosure itself serves as an alignment fixture for aligning a semiconductor laser and a lens to form an optical coupling. Since the enclosure is of small size, there is a lack of interior space that hinders manipulation of the parts into alignment. Following alignment of the laser and the lens, the enclosure must be hermetically sealed. The alignment of the laser and the lens, achieved with an accuracy measured in microns, can be disrupted when subjected to further process steps that achieve hermetic sealing of the package.

In many applications the emission from the laser must be coupled into an optical fiber. Coupling between an optical fiber and a semiconductor laser is subject to disadvantages and requires a high degree of care in fabrication. A direct attachment of an optical fiber to the laser can be disrupted, because the operating temperature of the laser will fluctuate and cause different dimensional changes respectively in the fiber and the laser. The dimensional changes in response to temperature fluctuation will cause the fiber to change position with respect to the laser or become separated from the laser.

Direct coupling is generally inefficient because of a wide disparity in the dimensions of the guided modes in the laser and in the fiber. This can be overcome by the use of a lens for mode size matching.

An optical coupling is subject to further disadvantages arising from use of a lens to focus optical emission from a laser on an optical fiber. It is difficult to achieve precision optical alignment of the lens and the laser. The fiber can become misaligned due to dimensional changes with temperature fluctuations.

SUMMARY OF THE INVENTION

According to an aspect of the invention, an alignment fixture in the form of an optical bench opticlly couples a semiconductor laser with a lens and with an optical fiber. The laser, lens and optical fiber are mounted on the optical bench before the optical bench is placed within the confines of an enclosure. The absence of the enclosure enables unobstructed manipulation of the parts into alignment on the optical bench.

According to another aspect of the invention, the optical bench defines an optical axis with an origin at the front facet of the laser.

According to another aspect of the invention, the lens is aligned with substantial precision along the optical axis and is focused upon the front facet. The lens tranmits optical emission of the front facet into an end of the optical fiber aligned along the optical axis.

According to another aspect of the invention, the lens is assembled with a positioning means including an optical diaphragm, a pedestal against the lens supporting the diaphragm and a holder constructed for attached mounting on the optical bench.

According to another aspect of the invention, a portion of the optical fiber is anchored to the optical bench and another portion of the fiber is held by a tube that hermetically seals the fiber and that is useful for applying a column load on the fiber such that the fiber ends are under a predetermined stress and stabilized against movement from or breakage from its anchored points over a range of operating temperatures of the laser.

According to another aspect of the invention, the optical axis along the optical bench is established by a line of sight of a television camera focused upon a front facet of optical emission of the laser, and the lens with the positioning means on the optical bench is aligned with considerable accuracy using the line of sight and using the optical emission as the focus of the lens.

OBJECTS OF THE INVENTION

An object of the invention is to provide an optical bench along which is defined an optical axis for alignment of an optical coupling of a semiconductor laser, a lens and an optical fiber, prior to mounting the optical bench in an enclosure that is constructed for being hermetically sealed.

Another object of the invention is to provide an optical bench along which is defined an optical axis, a semiconductor laser on the bench, a lens and a positioning means for positioning the lens with considerable accuracy along the optical axis.

Another object of the invention is to provide a semiconductor laser on an optical bench along which is defined an optical axis defined by a line of sight of a television camera focused on the laser, a lens and a positioning means for positioning the lens along the line of sight using the optical emission of the laser as the focus of the lens.

Other advantages of the invention will be apparent by way of example from a detailed description that follows and from accompanying drawings, which together disclose, by way of example, embodiments of the invention.

DESCRIPTION OF THE DRAWINGS

FIG. 4 is a diagrammatic view illustrating a technique for alignment of the semiconductor laser and lens assembly along an optical axis of the optical bench.

FIG. 6 is an enlarged longitudinal section view of a portion of the optical fiber assembly shown in FIG. 5.

FIG. 7 is an enlarged elevation in section of the optical bench before mounting in an enclosure.

FIGS. 1 and 7 illustrate an optical bench 12 in the form of an elongated platform 13 fabricated in one piece from heat conductive material. A planar surface 14 of the optical bench extends between a pair of laterally spaced apart pillars 15, 15 and perpendicular to an external datum surface 16' on an end wall 16 having an opening 17 with an axis that is elevated and parallel with respect to the planar surface 14. A groove 18 is recessed angularly in the planar surface 14 near an end 19 opposite the end wall 16. A base 20 carries a semiconductor laser 21, shown schematically. The base 20 is fabricated from a plate of electrically insulative ceramic that has a metal film surface that is bonded to the surface 14 of the optical bench 12. A second base 22 of ceramic is mounted in the recess 18 and projects from the recess 18 at an angle with the planar surface 14. The second base 22 carries a PIN diode 23, shown schematically, in alignment with a rear facet of optical emission of the semiconductor laser 21.

According to known principles of operation, the laser 21 produces optical emission from two edges or facets. The PIN diode 23 monitors optical emission from a rear facet and produces an output voltage that is a measure of the emission being monitored. The diode 23 is angular with the axis of emission and is set back sufficiently to avoid reflection of emission reversely along the axis. The output voltage is sampled and used to control a voltage supply circuit, not shown, that supplies current to the laser 21, activating the laser 21 to produce optical emission.

The optical bench 12 has a particular advantage in thermally coupling the laser 21, thereby eliminating the need for heat sink architecture within the semiconductor laser 21 itself. The pillars 15, 15 and the bottom of the optical bench 12 surround the laser 21 to provide a temperature modulator and a heat sink. The optical bench 12 is sufficiently thick to avoid warped distortion by thermal expansion or contraction with fluctuation in the operating temperature of the laser 21. The optical bench 12 is mounted by being soldered by its bottom surface 12'.

Figure 2:
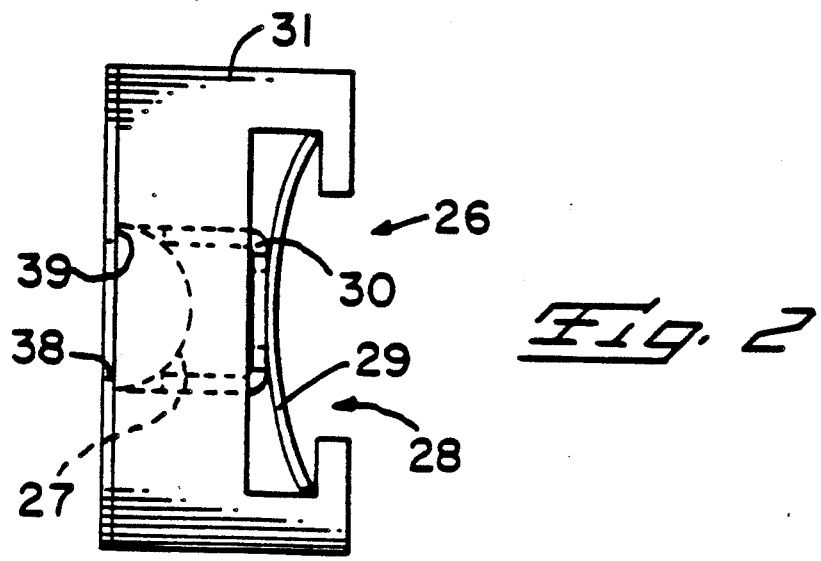
FIG. 2 is an enlarged top view of a lens assembly for the bench shown in FIG. 1.
Figure 3:
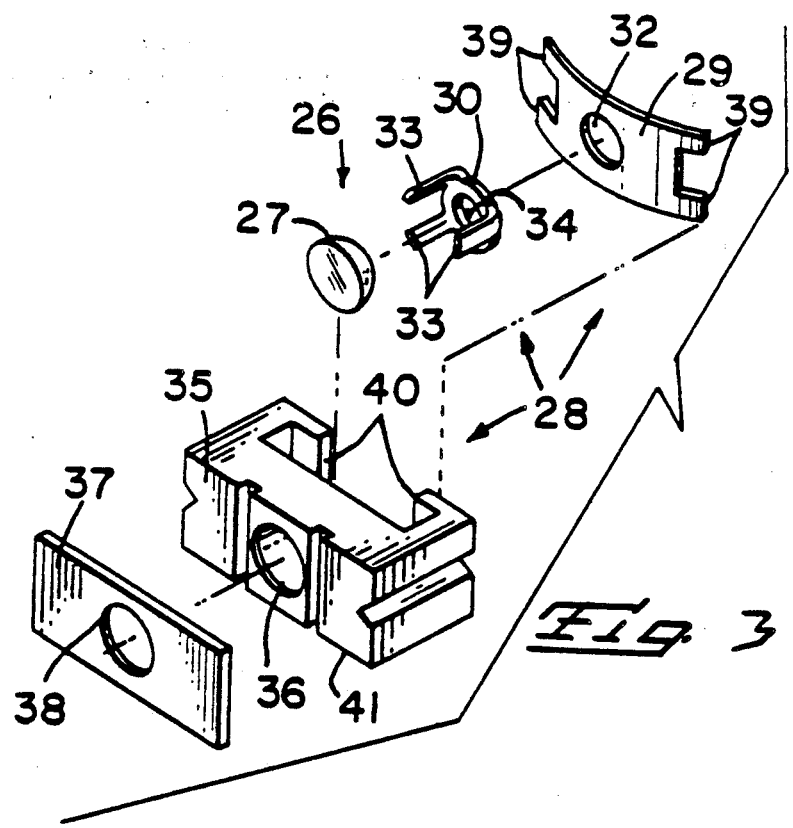
FIG. 3 is an enlarged perspective view with parts exploded of the lens assembly shown in FIG. 2.

The optical bench 12 advantageously provides a means for optically coupling the laser 21. With reference to FIGS. 2 and 3, a lens assembly 26 comprises a hemispherical lens 27 having a diameter of about 2 millimeters and fabricated from optical quality silicon and coated with known antireflective optical coating. The lens 27 is assembled with a positioning means 28 including an optical diaphragm 29, a pedestal 30 against the lens 27 and the diaphragm 29 and a holder 31 constructed for attached mounting on the optical bench. The optical diaphragm 29 of metal has a diaphragm aperture 32 aligned with the spherical surface of the lens 27. The pedestal 30 is formed of thin metal with three legs 33, 33, 33 bent out of the plane of the thin metal and radially spaced about a central opening 34 in alignment with the diaphragm aperture 32. The legs 33, 33, 33 engage the spherical surface and hold the diaphragm 29 at a distance from the lens 27.

The lens 27, pedestal 30 and diaphragm 29 are mounted in the lens holder 31 fabricated from copper and plated with nickel and then a layer of gold. The lens holder 31 has a wall 35 with a cylindrical opening 36 receiving the lens 27. The lens holder 31 has a plate 37 bonded externally to the wall 35. The plate 37 has an opening 38 less than the diameter of the opening 36 to provide a circular lip around the opening 37 against which the plano surface of the lens 27 engages. The diaphragm 29 is convex curved toward the lens 27. Trailing edges 39 of the curved diaphragm 29 seat against a bifurcated back wall 40 of the lens holder 35. The curved diaphragm 29 provides a leaf spring that urges the lens 27 to seat against the plate 37. The lens 27 is in fixed position on the lens assembly 26. The lens holder 31 has a planar bottom 41 and is adapted for precise mounting on the optical bench 12.

As shown in FIG. 4, a vidicon 42 sights along an optical axis 43 along the optical bench 12 perpendicular to the datum surface 16' and from the front facet of emission of the laser 21 and through the opening 17 of the optical bench. The laser 21 is temporarily activated to produce optical emission. The vidicon 42 focus is directed upon the front facet of optical emission and transmits an image of the emission to a CRT monitor 44. The vidicon 42 is of a type which can electronically generate a cross hair and overlay the cross hair at the focus. An image of the cross hair appears on the CRT 44. The lens assembly 26 is then placed on the optical bench 12 and is adjusted to a desired position on the optical bench 12 while maintaining the flat or plano surface of the hemispherical lens 27 parallel to the datum surface 16'. The desired position is established when the lens 27 is focused upon the front facet of emission and the lens 27 transmits the emission precisely along the optical axis 43. The desired position becomes known by viewing the image of the emission on the CRT monitor 44, and watching the image of the emission shift as the lens assembly 26 is adjusted in position on the optical bench 12. When the image of the emission on the CRT monitor 44 coincides with the cross hair image of the CRT monitor 44, the desired position of the lens assembly 26 is attained. The lens assembly 26 is clamped in place. The lens assembly 26 is aligned with zero tilt from direct alignment with the beam of laser emission. The tilt position may be adjusted before the lens assembly 26 is clamped in its final position. The clamped lens assembly 26 is secured by solder to the optical bench 12.

The goal of the lens alignment is to align the axis of the focused beam to the axis of the fiber and yet avoid reflection from the fiber facet back into the laser. Maintaining reflection at the level of −50 dB or less is critical to avoid spectral instability and deviations from linearity in the light versus current characteristic of the laser. This is best accomplished by beveling the fiber facet, also called the optical face, at an angle of 6° or more. This angle is determined by the numerical aperture of the fiber. For a fiber made of quartz, the resulting numerical aperture requires a bevel at an angle of 6°. This implies that the beam to be coupled must have a tilt angle equal to one-half the bevel angle of the fiber facet. The specific relationship is determined by the index of refraction of the fiber. Thus, a tilt angle must be added to the laser beam. This is done by aligning with zero tilt using the vidicon system and then displacing the lens by a predetermined amount to direct the beam to a tilted position from the zero tilt position. The resulting relationship between the tilt angle and the displacement is set by the magnification of the lens. In a typical system, magnification is 5 and a lens displacement of 7/10 of a mil will produce a tilt angle of 3°.

Figure 5:
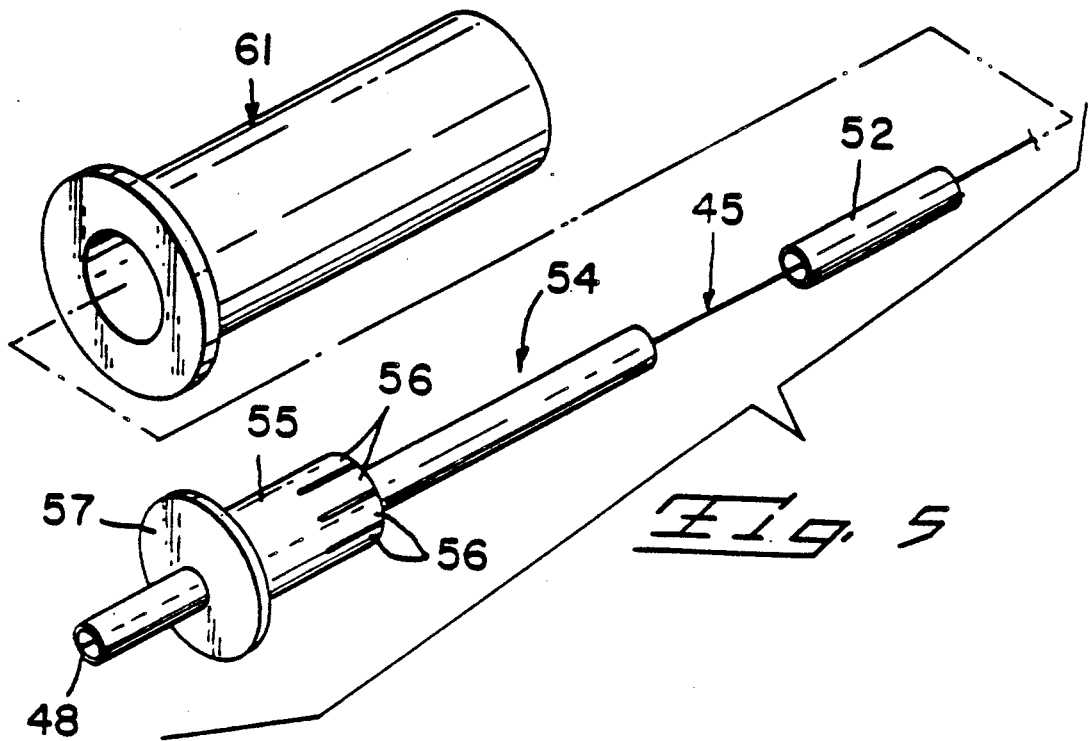
FIG. 5 is an enlarged perspective view of an optical fiber assembly with parts exploded.

FIGS. 5 and 6 show a length of optical fiber 45 having a relatively thick layer 46 of copper divided into segments 46, 46 adhered along the length of the fiber 45. The layer 46 is formed first by a minute thickness of copper that is applied by electroless deposition on the fiber 45 to provide a conductive surface. The conductive surface is then capable of receiving elecrolytic deposition of additional copper to form the relatively thick layer 46. The segments 46, 46 are formed by selective deposition or by etching away the copper leaving only the segments 46, 46. A segment 46 is at one end 47 of the fiber 45 that is polished to provide an optical face 48. A first metal tube 49 concentrically encircles the end 47 of the fiber 45 and the segment 46, and is secured to the segment 46 with solder 50. Thereby, a limited length of the fiber 45 adjacent to its optical face 48 is secured to the interior of the tube 49. The fiber 45 extends freely along the interior of the tube 49 and projects outwardly of an open end 51 of the tube 49. The other segment 46 is concentrically encircled by a second metal tube 52 spaced along the length of the fiber 45 from the tube 49. The second tube 52 is secured by solder 53 to the segment 45 forming an hermetic seal, and thereby to complete an optical fiber assembly 54.

Figure 1:
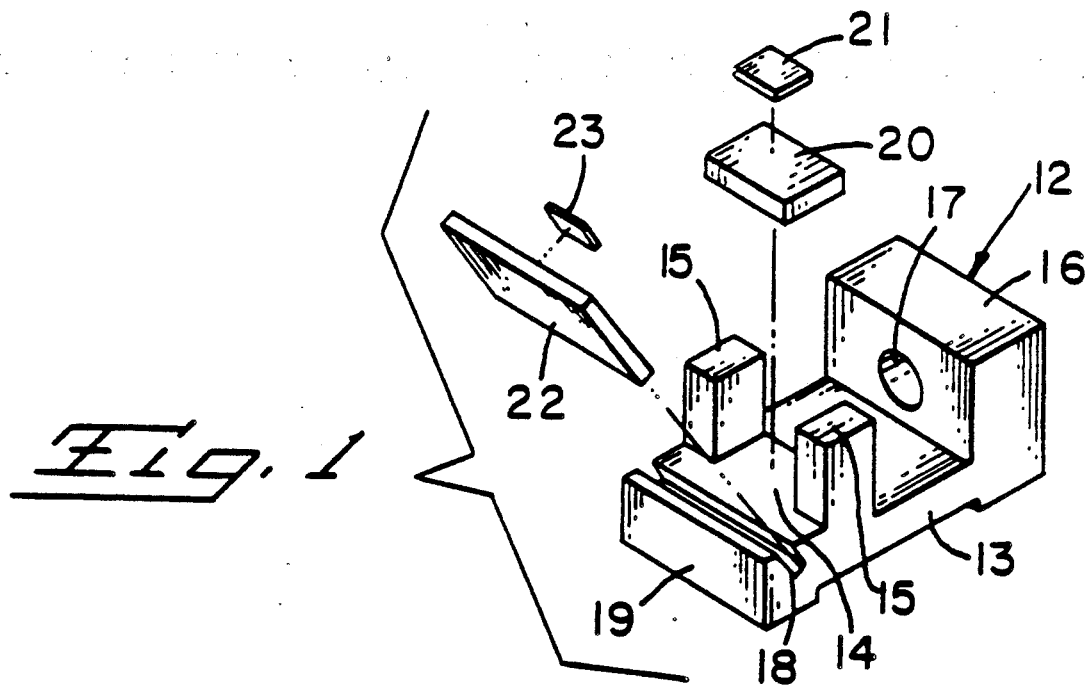
FIG. 1 is an enlarged perspective view with parts exploded to illustrate an optical bench, a semiconductor laser and a monitor of facet emission.

FIG. 5 shows the optical fiber assembly 54 with the tube 49 surrounded concentrically by a sleeve bushing 55 having resilient fingers that radially grip the tube 49, and a radially outward projecting flange 47. As shown in FIGS. 1 and 7, the bushing 55 is placed against the wall 16 of the optical bench 12, with the tube 49 and the optical fiber 45 projecting through the opening 17 toward the lens 27 which was previously mounted on the optical bench 12. Initially the optical face 48 of the fiber 45 is within the opening 17 and flush with the end of the interior 21 of the bushing 55. The bevel of the fiber facet is aligned with the bushing 55 and with the beam of laser emission.

The laser 21 is temporarily activated to produce optical emission. The emission is transmitted by the lens 27 along the optical axis 43 and into the optical fiber 45 through its optical face 48 which faces toward the lens 27. According to known techniques the optical emission that emerges from the output end 58 of the optical fiber 45 is continuously measured for relative intensity. This measurement advantageously assists in locating the bushing 55 in a desired position. The desired position of the bushing 55 becomes known by viewing changes in the measured intensity as the position of the bushing 55 is adjusted. When the measure of intensity is at a relative maximum, the desired position of the bushing 55 is established. The bushing 55 is secured in desired position on the wall 16 by solder.

The measurement of optical intensity is further advantageous in locating the optical face 48 of the optical fiber 45 in desired position along the optical axis 43. With the bushing 55 secured in place, the position of the tube 49 is adjusted while the intensity of the optical emission is measured. More specifically, the tube 49 is moved with respect to the interior of the secured bushing 55, closer to or further from the lens 27, thereby causing a corresponding adjustment in position of the optical face 48 of the optical fiber 45 and a corresponding fluctuation of the measured intensity. When the measure of intensity is at a relative maximum the desired position of the tube 49 and of the optical face 48 is established. The tube 49 in desired position is soldered to the interior of the bushing 55. The bushing 55, the tube 49, solder 50 and the corresponding segment of layer 46 provides positioning means for positioning the optical face 48 of the fiber 45 in desired position along the optical axis 43 and for mounting the fiber 45 to the optical bench 12.

The optical bench 12 advantageously allows complete assembly of an optical coupling of the laser 21, lens 27 and optical fiber 45 before the optical bench 12 is inserted into an enclosure not shown. The bottom surface 12' of the optical bench 12 can be soldered to a corresponding surface within the confines of the enclosure. The tube 52 also may be held in a metal ferrule 61 anchored to the enclosure. The tube 52 is positioned with respect to the tube 49 such that a column load is applied on the fiber 45, which causes the fiber 45 to be bent into a continuous and smoothly curved configuration, with a large radius of curvature, substantially within the interior of the tube 52, and between the solder attachment points 50, 53, and as shown by the dotted line 66 in FIG. 6.

It is known from euler's formula of mathematics, that a strut, assumed to be bent slightly from its axis, has a calculated strength to resist an increase in an axially directed compression load, or column load, despite an increase in bending of the strut. However, as the column load is increased and the strut is bent further, a point is reached whereby the strut can undergo a range of bent deflection without a corresponding increase in column load over the corresponding range of deflection. The optical bench 12 has the advantage of applying a column load upon the optical fiber 45 causing the fiber 43 to be bent slightly, and reaching the point whereby the fiber 45 can undergo a range of bent deflection without a corresponding increase in column load. Thereafter, fluctuation of the operating temperature of the laser 21, that causes corresponding thermal expansion or contraction of the fiber 45, will cause corresponding fluctuation in bending deflection of the fiber 45 within the range of bent deflection without an increase in column load, which column load would be transmitted to the attachment points 50, 53 of the fiber 45 and would subject the anchoring points, or attachment points 50, 53, to undue strain or breakage, or cause the optical face 48 of the fiber 45 to shift away from its desired position where the relative maximum amount of optical emission is transmitted from the lens 27 to the optical face 48.

The optical bench is assembled in a series of soldering operations, as described. Each soldering operation uses a solder with slightly lower melting temperature than the melting temperature of solder used in a previous soldering operation. The optical bench is assembled with different assemblies, which enables the number of soldering operations for the same assembly to be limited in number. For example, solder alloy, 80 parts Au, 20 parts Sn, has a melting temperature of 280° C., and is used as the solder 50 and 53 to solder the tubes 49 and 52 to the fiber 45, and is used in another assembly to solder the lens holder 35 to the optical bench 12. The laser 21, base 20, diode 23 and base 22 have been secured on the optical bench 12 according to known techniques for high temperature, ceramic to metal bonding that is not distrubed by temperatures related to soldering operations. Solder alloy, 60 parts Pb, 40 parts In, has a melting temperature of 225° C. and is used to solder the bushing 55 to the wall 16 and the tube 49. Solder alloy 97 parts In, 3 parts Ag, has a melting temperature of 143° C., and is used to solder the ferrule 61 to the wall 60 and the tube 52. The specific alloys are exemplary only, since other alloys also are useful in performing the soldering operations. The order of assembly of the parts can be different than described, provided that the parts are assembled according to a procedure such that each soldering operation uses a solder with a melting temperature of at least 15° C. lower than the melting temperature of solder used in a previous soldering operation.

The invention has been disclosed by way of example with reference to the description and drawings. Other examples of the invention are intended to be covered by the spirit and scope of the claims.

We claim:

1. A method for optically coupling an optical device with a semiconductor laser, comprising the steps of;
   activating a semiconductor laser to produce optical emission from a facet of emission of the laser,
   transmitting an image of the facet of emission along an optical axis extending from the facet of emission along a platform on which the laser is mounted,
   focusing an optical lens on the facet of emission,
   adjusting the lens in position to the platform until an image of the facet of emission is transmitted by the lens along the optical axis,
   mounting the lens on the platform,
   aligning an optical face of an optical fiber along the optical axis extending from the lens, and
   mounting the optical fiber on the platform with the optical face in alignment with the optical axis.

2. A method according to claim 1, further comprising the steps of;
   focusing a vidicon on the facet of emission,
   aligning the vidicon along the optical axis,
   forming an image of the vidicon focus on a video monitor, and
   adjusting the position of the lens until the image of the facet of emission transmitted by the lens coincides with the image of the vidicon focus.

3. A method according to claim 1, further comprising the steps of;
   projecting a cross hair image of the optical axis on a video monitor, and
   aligning the image transmitted by the lens with the cross hair image.

4. A method as recited in claim 3, further comprising the steps of;
   focusing a vidicon on the facet of emission,
   aligning the vidicon along the optical axis,
   forming an image of the vidicon focus on a video monitor, and
   adjusting the position of the lens until the image of the facet of emission transmitted by the lens coincides with the image of the vidicon focus.

* * * * *